(12) United States Patent
Takeuchi

(10) Patent No.: US 7,019,220 B2
(45) Date of Patent: Mar. 28, 2006

(54) SUPPORTING DEVICE FOR DISCRETE ELECTRIC COMPONENT

(75) Inventor: Atsushi Takeuchi, Aichi (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 0 days.

(21) Appl. No.: 10/347,451

(22) Filed: Jan. 21, 2003

(65) Prior Publication Data

US 2003/0141428 A1    Jul. 31, 2003

(30) Foreign Application Priority Data

Jan. 30, 2002    (JP)    ............................ P2002-021805

(51) Int. Cl.
*H01B 17/00*    (2006.01)
*H01R 13/267*    (2006.01)

(52) U.S. Cl. .................. 174/138 G; 439/356; 439/379; 248/309.1

(58) Field of Classification Search ................ 248/351, 248/694, 346.5, 200.1, 27.1, 27.3, 309.1, 248/311.2, 314; 439/699.2, 356, 490, 619, 439/379; 362/226; 361/820, 809; 174/138 G
See application file for complete search history.

(56) References Cited

U.S. PATENT DOCUMENTS

| | | | | |
|---|---|---|---|---|
| 4,620,070 A | * | 10/1986 | Ruehl | ....................... 379/27.08 |
| 5,426,265 A | | 6/1995 | Savage, Jr. | |
| 5,625,942 A | * | 5/1997 | Casey | ......................... 29/751 |
| 5,683,257 A | * | 11/1997 | Kobayashi et al. | ......... 439/76.2 |
| 5,722,860 A | * | 3/1998 | Pan | ............................ 439/619 |
| 5,820,419 A | * | 10/1998 | Liao | ......................... 439/699.2 |
| 6,083,050 A | * | 7/2000 | Hsu | ............................ 439/619 |
| 6,120,312 A | * | 9/2000 | Shu | ............................ 439/356 |
| 6,183,310 B1 | * | 2/2001 | Shu | ......................... 439/699.2 |
| 6,275,384 B1 | | 8/2001 | Kuo | |
| 6,409,530 B1 | * | 6/2002 | Zhao et al. | ................. 439/188 |
| 6,431,906 B1 | * | 8/2002 | Belopolsky | ................. 439/490 |

FOREIGN PATENT DOCUMENTS

| | | |
|---|---|---|
| JP | 03-148896 | 6/1991 |
| JP | 06-085426 | 3/1994 |
| JP | 07-249851 | 9/1995 |
| JP | 10-247770 | 9/1998 |
| JP | 10-289971 | 10/1998 |
| JP | 11-307900 | 11/1999 |

\* cited by examiner

*Primary Examiner*—Anita King
*Assistant Examiner*—Tan Le
(74) *Attorney, Agent, or Firm*—Morgan, Lewis & Bockius LLP

(57) ABSTRACT

A supporting device (21) for a discrete electric component is so designed as to include a supporting part (22), and this supporting part includes a main body (26), and a pair of first flange portions (27*a*, 27*b*) and a pair of second flange portions (28*a*, 28*b*) which are respectively provided on both sides of this main body. A first recess (29) is defined by the main body and a pair of the first flange portions, and a second recess (30) is defined by the main body and a pair of the second flange portions. These flange portions of the supporting part (22) have slanting portions at their upper end parts, and these flange portions are interrupted at a base end of the supporting part. The terminals (19, 20) of an LED (17) are inserted into the recesses of the supporting part, enabling the LED to be supported and held.

6 Claims, 4 Drawing Sheets

SUPPORTING DEVICE FOR DISCRETE ELECTRIC COMPONENT

BACKGROUND OF THE INVENTION

The present invention relates to a supporting device for a discrete electric component which supports and holds terminals of the discrete electric component.

FIG. 7 shows an example of a conventional supporting device for a discrete electric component. The discrete electric component such as an LED 1, for example, has a pair of terminals 2 and 3 which are relatively long and substantially in parallel to each other. Distal end portions of these terminals 2, 3 are bent forward in a state kept in parallel, and further bent so as to extend laterally, as shown in FIG. 7.

On the other hand, a base plate 4 made of plastic is provided with a supporting part 5 in a column shape having a substantially T-shape in cross section.

Then, by engaging, in advance, the terminals 2, 3 of the LED 1 with opposite sides of a main body 5a of the supporting part 5, the LED 1 is kept supported and held on the base plate 4, and in this state, the distal ends of the terminals 2, 3 are electrically connected to joint portions 4a, 4b of the base plate 4 by resistance welding joint, for example.

However, in the above described conventional case, there has been such a problem that the LED 1 is liable to be displaced in a direction of an arrow A before the electrical connection, and positions of the terminals to be electrically connected may come out of proper positions. Moreover, also after the electrical connection, there has been such an anxiety that in case where the LED 1 has received an outer force in the direction of the arrow A on occasion of assembling the base plate 4 and so on, the terminals 2, 3 may be inclined in that direction, and position of a light emitting part 1a may be displaced.

SUMMARY OF THE INVENTION

The present invention has been made in view of the above described circumstances, and its object is to provide a supporting device for a discrete electric component which can contribute to stabilization of positions to be electrically connected of terminals of the discrete electric component, and at the same time, can contribute to stabilization of posture of the discrete electric component in an electrically connected state.

In order to solve the aforesaid object, the invention is characterized by having the following arrangement.

(1) A supporting device for supporting a discrete electric component having a pair of terminals substantially in parallel to each other comprising:

a column shape main body on a mounting part;

a pair of first flange portions and a pair of second flange portions provided on opposite sides of the main body so as to project therefrom, respectively;

a first recess defined by the main body and the pair of first flange portions, into which one of the pair of terminals is inserted; and a second recess defined by the main body and the pair of second flange portions, into which the other of the pair of terminals is inserted, thereby supporting and holding the discrete electric component.

(2) The supporting device according to (1), wherein the main body, the pair of first flange portions and the pair of second flange portions are formed in substantially H-shape in cross section.

(3) The supporting device according to (1), wherein one of the pair of first flange portions and corresponding one of the pair of second flange portions have slanting portions at upper ends thereof, respectively.

(4) The supporting device according to (3), wherein distal end portions of the terminals are bent in one direction in a state kept in parallel to each other, and the terminals slide along the slanting portions and the one of the pair of first flange portions and the one of the pair of second flange portions, respectively, when the discrete electric component is attached to the supporting device.

(5) The supporting device according to (4), wherein the one of the pair of first flange portions and the one of the pair of second flange portions are interrupted at a base end of the main body to provide gaps allowing the distal ends of the terminals to pass therethrough.

(6) The supporting device according to (1), wherein the first recess and the second recess are formed in an arc-shaped groove, respectively.

(7) The supporting device according to (1), wherein the discrete electric component is a LED.

In The present disclosure relates to the subject matter contained in Japanese patent application No. 2002-021805 (filed on Jan. 30, 2002), which is expressly incorporated herein by reference in their entireties.

DETAILED DESCRIPTION OF PREFERRED EMBODIMENTS

First Embodiment

Now, with reference to FIGS. 1 to 5, a first embodiment of the present invention will be described.

Figure 5:
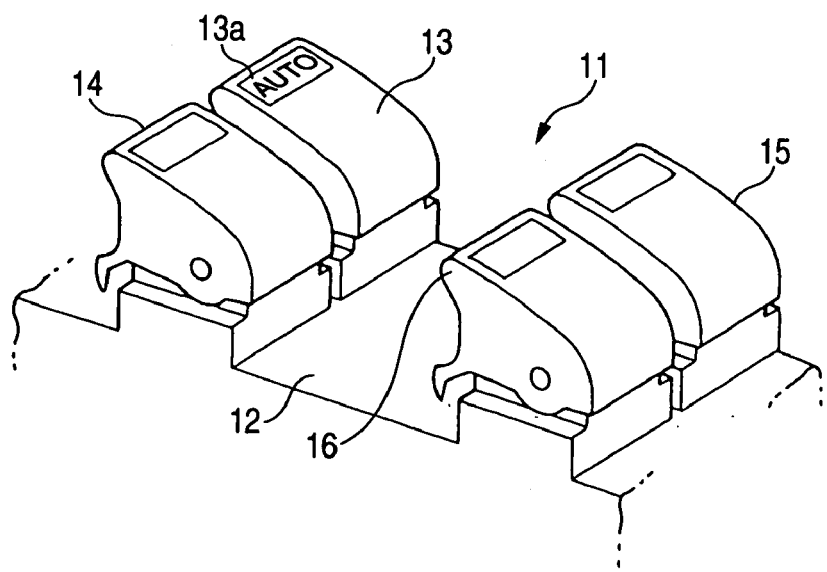
FIG. 5 is an external view of a power window switch.

FIG. 5 shows an external view of a power window switch 11 of a vehicle, in which switch knobs 13 to 16 are provided on a switch case 12 so as to be rotated upward and downward. Based on upward and downward operations of the respective switch knobs 13 to 16, a window on a driver's seat side, a window on an assistant driver's seat side, and windows on left and right sides of a rear seat are adapted to be opened and closed. On the switch knob 13 corresponding to the window on the driver's seat side, there is formed a display part 13a indicating that it is a knob for operating the driver's seat window. This display part 13a is so designed as to be optically displayed.

Figure 4:
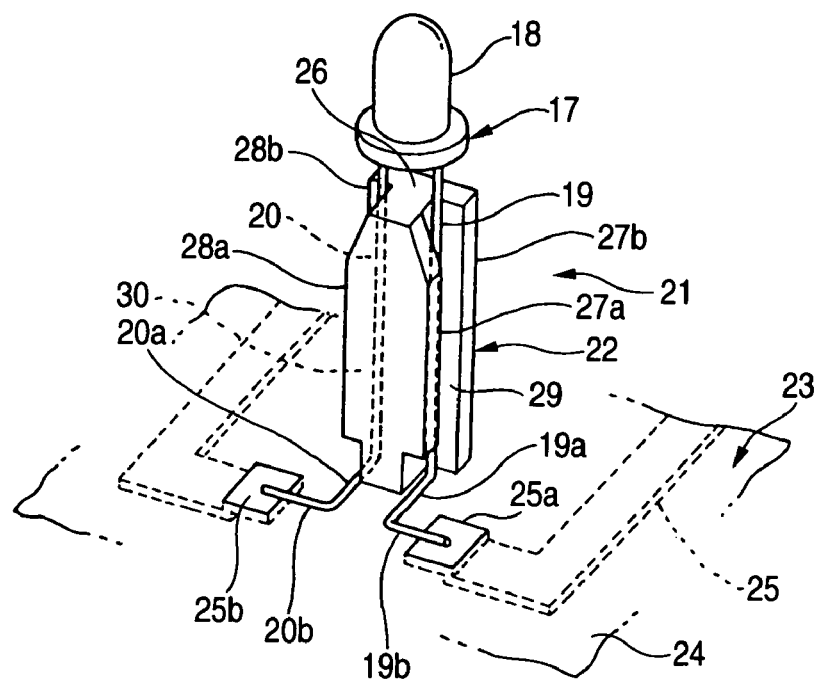
FIG. 4 is a perspective view of the supporting device prior to assembling.

There is shown, in FIG. 4, an LED 17 which is a discrete electric component and a supporting device 21 for the discrete electric component provided below the aforesaid display part 13a. The LED 17 is constituted by an LED body (light emitting part) 18, and a pair of terminals 19 and 20 which are relatively long and in parallel to each other. Distal end portions of the terminals 19, 20 are bent (portions 19a, 20a) in one direction (forward in FIG. 4) while they are kept in parallel, and further bent to the right and left (portions 19b, 20b).

The supporting device 21 for the discrete electric component is so designed as to include a supporting part 22, and this supporting part 22 is provided on a circuit board 23 which is a mounting part. This circuit board 23 includes a conductor 25 molded in a substrate 24 made of plastic, and joint portions 25a, 25b of the conductor 25 are exposed.

The aforesaid supporting part 22 is formed in a column shape, as a whole, by integral molding for example, on the aforesaid substrate 24. The supporting part 22 includes a main body 26, and a pair of first flange portions 27a, 27b and a pair of second flange portions 28a, 28b which are respectively provided so as to project from opposite sides of this main body 26, and the supporting part 22 has a substantially H-shape in cross section.

A first recess 29 is defined by the aforesaid main body 26 and a pair of the first flange portions 27a, 27b, as well as a second recess 30 is defined by the aforesaid main body 26 and a pair of the second flange portions 28a, 28b.

The flange portion 27a which is one of the first flange portions of the supporting part 22, and the flange portion 28a corresponding to this flange portion 27a, which is one of the second flange portions, are slanted at their upper end parts (diagonal parts 27c, 28c), and these flange portions 27a and 28a are interrupted at a base end of the supporting part 22 (parts 27d, 28d) to provide slanting portions.

The LED 17 is supported and held by the supporting part 22, and at the same time, the portions 19b, 20b of the terminals 19, 20 are joined to the joint portions 25a, 25b by resistance welding, for example.

Figure 1:
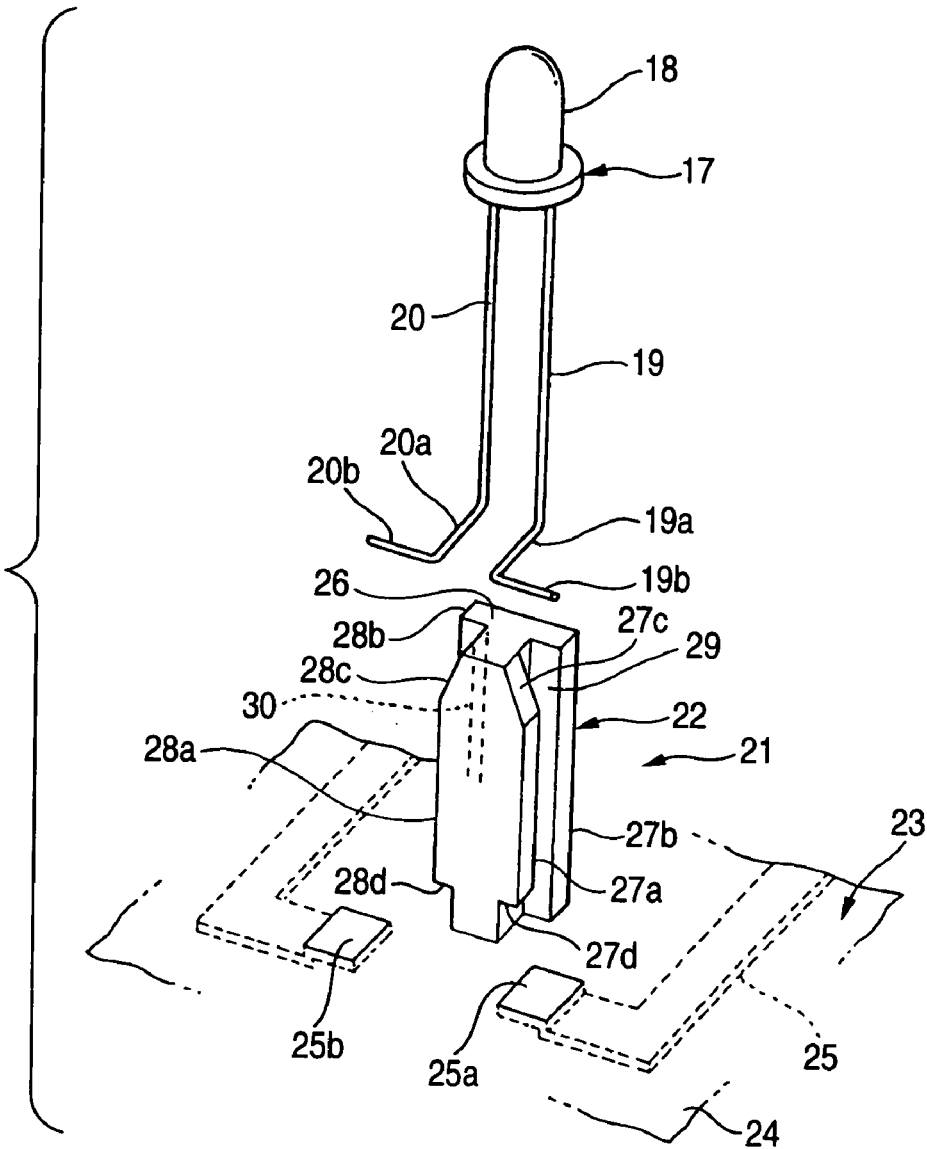
FIG. 1 is a perspective view showing a first embodiment of a supporting device for a discrete electric component according to the present invention, prior to assembling.
Figure 2:
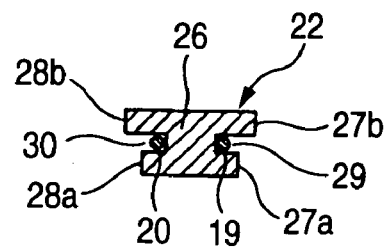
FIG. 2 is a cross sectional view of a supporting part.
Figure 3:
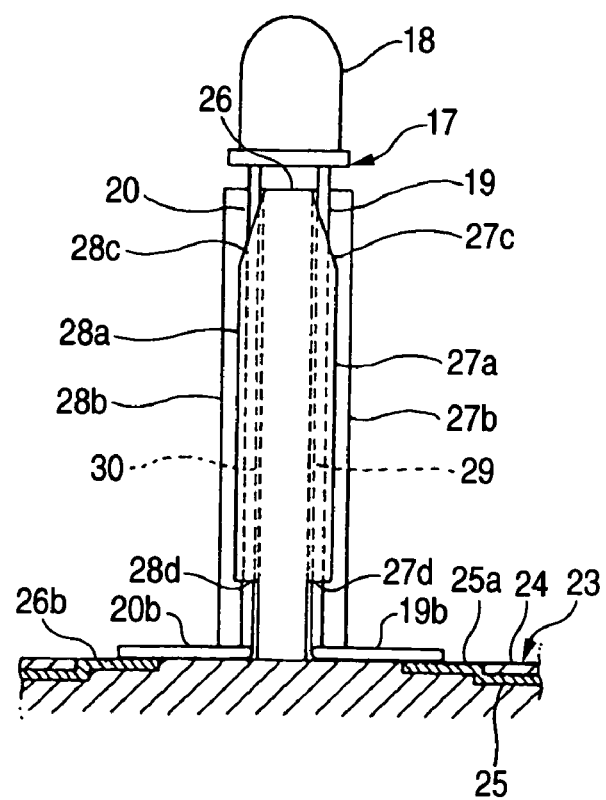
FIG. 3 is a front view of the supporting device in an assembled state.

Describing now steps for supporting and holding the above described LED 17, the LED 17 is positioned above the supporting part 22, as shown in FIG. 1, and from this state, the LED 17 is moved downward, abutting the portions 19a, 20a of the terminals 19, 20 against the slanting portions 27c, 28c, so as to slide along the diagonal parts. Then, the terminals 19, 20 are opened apart by their elasticity and slide down from the slanting portions 27c, 28c to the lower ends of the flange portions 27a, 28a. The terminals 19, 20 are restored to the original state at the interrupted parts 27d, 28d of the flange portions 27a, 28a by elastic restoring force. In this manner, the terminals 19, 20 enter into the first recess 29 and the second recess 30 respectively. As the results, the LED 17 is supported and held by the supporting part 22 (Refer to FIG. 3 and FIG. 4). In this state, the distal end portions 19b, 20b of the terminals 19, 20 are positioned on the joint portions 25a, 25b. In this state of position, the welding joint will be conducted.

As described above, according to the present embodiment, a pair of the terminals 19, 20 of the LED 17 are inserted into the first recess 29 and the second recess 30, so that the LED 17 will be supported and held without misalignment. Accordingly, the posture and the position of the LED 17 will not be displaced in case of electrically connecting the terminals 19, 20, and also after the electrical connection has been completed.

In particular, although a pair of the terminals 19, 20 have the bent portions 19a, 20a, a pair of the terminals 19, 20 can favorably enter into the first recess 29 and the second recess 30, because the first flange portion 27a and the second flange portion 28a of the supporting part 22 have slanting portions at their upper ends, respectively, and these flange portions 27a and 28a are interrupted at their base ends. Specifically, the bending distal end portions 19b, 20b of a pair of the terminals 19, 20 move along the slanting portions 27c, 28c of the first flange portion and the second flange portion to be opened apart from each other, and are restored to the original state at the interrupted parts 27d and 28d of the first flange portion 27a and the second flange portion 28a. Consequently, a pair of the terminals 19, 20 will favorably enter into the first recess 29 and the second recess 30.

Second Embodiment

Figure 6:
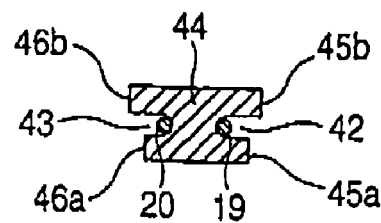
FIG. 6 is a view corresponding to FIG. 2 showing a second embodiment according to the present invention.
Figure 7:
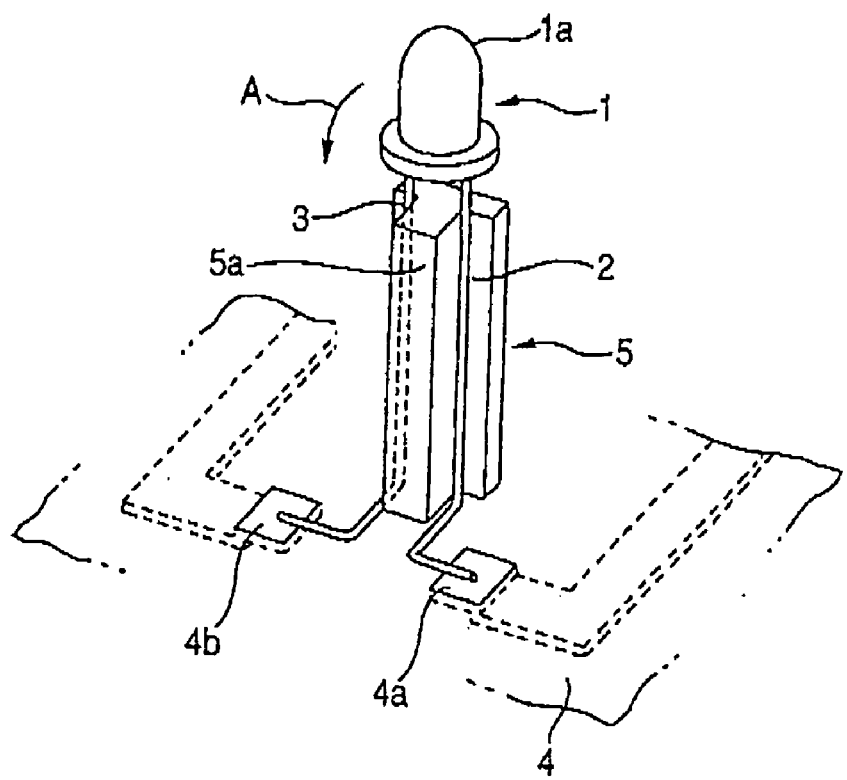
FIG. 7 is a perspective view of an external appearance of a supporting device for a discrete electric component in a conventional example.

FIG. 6 shows a second embodiment of the present invention. A supporting part 41 according to the second embodiment is designed in such a manner that inner faces of a main body 44, a pair of first flange portions 45a, 45b, and a pair of second flange portions 46a, 46b are rounded, in order that a first recess 42 and a second recess 43 may be formed in an arc-shaped groove, respectively. In this manner, substantially same operational effects as in the first embodiment can be expected.

The present invention is not limited to the above described embodiments, but the discrete electric components may include other components beside the LED, for example, transistor, resistance, or condenser, etc.

As apparent from the foregoing description, the present invention can contribute to stabilization of the positions to be electrically connected of the terminals of the discrete electric component, and also contribute to stabilization of the posture of the discrete electric component in an electrically connected state.

What is claimed is:

1. A supporting device supporting a discrete electric component having a pair of terminals substantially in parallel to each other, the supporting device comprising:
a column shaped main body having a top end and a base end, the base end proximate a mounting part;
a pair of first flange portions and a pair of second flange portions provided on opposite sides of the main body so as to project therefrom, respectively, the pair of first flange portions and the pair of second flange portions each having upper ends and lower ends;

a first recess defined by the main body and the pair of first flange portions for inserting one of the pair of terminals; and a second recess defined by the main body and the pair of second flange portions, for inserting the other of the pair of terminals, wherein one of the pair of first flange portions and a corresponding one of the pair of second flange portions have slanting portions at upper ends thereof, the slanting portions extending diagonally across said upper ends of the flange portions, wherein distal ends of the terminals substantially in parallel to each other are bent in one direction; and wherein the slanted portions are shaped such that the terminals of the discrete electric component are capable of sliding along the slanting portions and along the one of the pair of first flange portions and the one of the pair of second flange portions, respectively, to attach the discrete electric component to the supporting device.

2. The supporting device according to claim 1, wherein the main body, the pair of first flange portions and the pair of second flange portions are formed in substantially H-shape in cross section.

3. The supporting device according to claim 1, wherein the pair of first flange portions and the pair of second flange portions are parallel to each other, respectively.

4. The supporting device according to claim 3, wherein the lower ends of the one of the pair of first flange portions and the one of the pair of second flange portions are interrupted at the base end of the main body to provide gaps for allowing distal ends of the terminals to pass therethrough.

5. The supporting device according to claim 1, wherein the first recess and the second recess are formed in an arc-shaped groove, respectively.

6. The supporting device according to claim 1, wherein the discrete electric component is an LED.

* * * * *